United States Patent [19]

Solomon

[11] Patent Number: 5,108,938
[45] Date of Patent: Apr. 28, 1992

[54] METHOD OF MAKING A TRENCH GATE COMPLIMENTARY METAL OXIDE SEMICONDUCTOR TRANSISTOR

[75] Inventor: Allen L. Solomon, Fullerton, Calif.

[73] Assignee: Grumman Aerospace Corporation, Bethpage, N.Y.

[21] Appl. No.: 664,464

[22] Filed: Mar. 1, 1991

Related U.S. Application Data

[63] Continuation of Ser. No. 326,635, Mar. 21, 1989, abandoned.

[51] Int. Cl.$^5$ ............................................. H01L 21/70
[52] U.S. Cl. ........................................ 437/41; 437/29; 437/34; 437/40; 437/56; 431/203; 431/228
[58] Field of Search ..................... 437/29, 38, 40, 41, 437/34, 56, 162, 203, 228, 233, 235; 357/40, 23.4

[56] References Cited

U.S. PATENT DOCUMENTS

| | | | |
|---|---|---|---|
| 4,316,203 | 2/1982 | Tohegi | 357/23.4 |
| 4,442,591 | 4/1984 | Haken | 437/41 |
| 4,455,740 | 1/1984 | Iwai | 357/23.4 |
| 4,475,279 | 10/1984 | Gahle | 437/41 |
| 4,571,513 | 2/1986 | Lade et al. | 357/23.4 |
| 4,604,150 | 8/1986 | Lin | 437/162 |
| 4,676,847 | 6/1987 | Lin | 437/162 |
| 4,767,722 | 8/1988 | Blanchard | 437/41 |

FOREIGN PATENT DOCUMENTS

| | | | |
|---|---|---|---|
| 0221593 | 5/1987 | European Pat. Off. | 437/38 |
| 197712 | 5/1977 | Fed. Rep. of Germany | 357/23.4 |
| 2724165 | 5/1977 | Fed. Rep. of Germany | |
| 0015274 | 2/1977 | Japan | 357/23.4 |
| 0149771 | 12/1978 | Japan | 357/23.4 |
| 0181045 | 10/1984 | Japan | 437/38 |

OTHER PUBLICATIONS

R. Gegorian and G. C. Temes, Analog MOS Integrated Circuits For Signal Processing, pp. 98, 99, John Wiley & Sons, N.Y., N.Y. (1986).
Ghandi, VLSI Fabrication Principles, John Wiley and Sons, 1983, pp. 589–595.

*Primary Examiner*—Tom Thomas
*Attorney, Agent, or Firm*—Stetina and Brunda

[57] ABSTRACT

A complimentary trench gate metal-oxide semiconductor transistor is disclosed along with a resulting product. The process for forming the transistor comprises forming a trench within the semiconductor substrate, wherein the semiconductor substrate is doped to a first relative type. A layer doped to a second relative type is applied about the surface of the trench. An insulating layer is then formed within the trench upon said first layer. A region of gate material is formed within the trench upon said insulating layer. Source and drain regions are formed by doping first and second regions adjacent the trench to the opposite relative polarity of the substrate. Segments of the first and second regions are then doped to the same relative polarity as the substrate, the segments being isolated from the substrate by remaining portions of the first and second doped regions. The first layer therefore extends between said source and drain about said trench, and wherein the gate region is isolated from the first layer by the insulating layer.

10 Claims, 2 Drawing Sheets

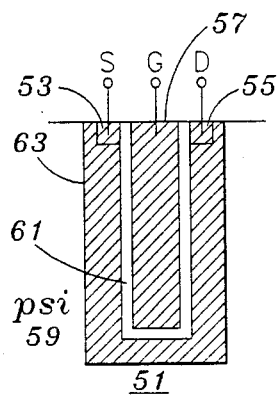
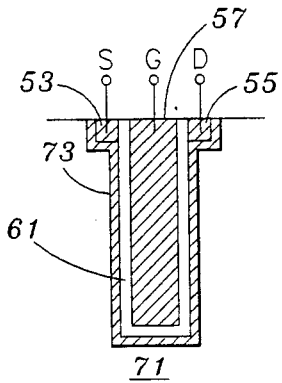
FIG. 4     FIG. 5
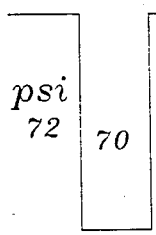
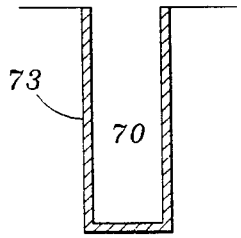
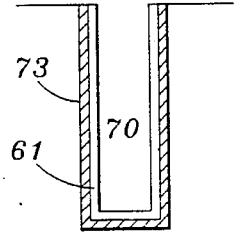
FIG. 6     FIG. 7     FIG. 8
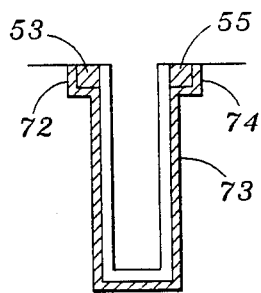
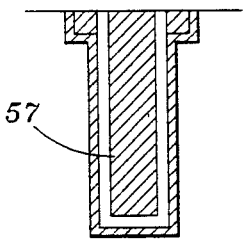
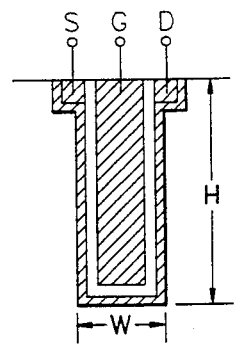
FIG. 9     FIG. 10     FIG. 11

METHOD OF MAKING A TRENCH GATE COMPLIMENTARY METAL OXIDE SEMICONDUCTOR TRANSISTOR

This is a continuation of copending application Ser. No. 07/326,635 filed on Mar. 21, 1989, now abandoned.

BACKGROUND OF THE INVENTION

The present invention finds application in connection with thin silicon plates or wafers formed to support a multiplicity of monolithically integrated data processor circuits. More particularly, the invention is directed to the production of circuits formed on silicon wafers for interfacing devices such as infrared detector elements to a processing network that amplifies, stores and interprets detected infrared frequency signals.

The infrared spectrum covers a range of wavelengths longer than the visible wavelengths, but shorter than microwave wavelengths. Visible wavelengths are generally regarded as between 0.4 and 0.75 micrometers. The infrared wavelengths extend from 0.75 micrometers to 1 millimeter. The function of infrared detectors is to respond to the energy of a wavelength within some particular portion of the infrared region.

Heated objects generate radiant energy having characteristic wavelengths within the infrared spectrum. Many current infrared image detection systems incorporate arrays with large numbers of discrete, highly sensitive detector elements, the electrical outputs of which are connected to processing circuitry. By analyzing the pattern and sequence of detector element excitation, the processing circuitry can identify and track sources of infrared radiation. Though the theoretical performance of such contemporary systems is satisfactory for many applications, it is difficult to construct structures that adequately interface large numbers of detector elements with associated circuitry in a practical and reliable manner. Consequently, practical applications for contemporary infrared image detector systems have necessitated further advances in the areas of miniaturization of the detector array and accompanying circuitry, of minimization of circuit generated noise and of improvements in the reliability and economical production of detector arrays and the accompanying circuitry.

Contemporary arrays of detectors, useful for some applications, may be sized to include 256 detector elements on a side, or a total of 65,536 detectors, the size of each square detector being approximately 0.009 centimeters on a side, with 0.00116 centimeters spacing between detectors. Such a subarray would therefore be 2.601 centimeters on a side. Interconnection of such a subarray to processing circuitry would require connecting each of the 65,536 detectors to processing circuitry within a square, a little more than one inch on a side. Each subarray may, in turn, be joined to other subarrays to form an array that connects to 25,000,000 detectors or more. As would be expected considerable difficulties are presented in electrically connecting the detector elements to associated circuitry, and laying out the circuitry in a minimal area. The problems of forming processing circuitry in such a dense environment require minimization of the surface area used for the circuitry.

The outputs of the detector elements typically undergo a series of processing steps in order to permit derivation of the informational content of the detector output signal. The more fundamental processing steps, such as preamplification, tuned band pass filtering, clutter and background rejection, multiplexing and fixed noise pattern suppression, are preferably done at a location adjacent the detector array focal plane. As a consequence of such on-focal plane, or up-front signal processing, reductions in size, power and cost of the main processor may be achieved. Moreover, on-focal plane signal processing helps alleviate performance, reliability and economic problems associated with the construction of millions of closely spaced conductors connecting each detector element to the signal processing network.

Aside from the aforementioned physical limitations on the size of the detector module, limitations on the performance of contemporary detection systems can arise due to the presence of electronic circuit generated noise, in particular, from the preamplifier. Such noise components can degrade the minimal level of detectivity available from the detector.

A type of noise that is particularly significant where the preamplifier operates at low frequency is commonly called flicker or 1/f noise. Because 1/f noise can be the principal noise component at low frequencies of operation, it is highly desirable that circuits operating within such frequencies be constructed in such a manner as to decrease 1/f noise to an acceptably low level.

U.S. Pat. No. 4,633,086, to Parrish, for Input Circuit For Infrared Detector, assigned to the common assignee, describes one technique for biasing the on-focal plane processing circuit to maintain the associated detector in a zero bias condition, thus reducing 1/f noise and enhancing the signal to noise ratio of the circuit.

Reduction of 1/f noise in the preamplifier, where the preamplifier transistor is a field effect device, is conventionally obtained by increasing the area of the channel region under the gate. This large area over the semiconductor substrate surface results in a decrease in circuit component density or decreased circuit component miniaturization. In the present invention, the channel region of a metal-oxide-semiconductor (MOS) field effect transistor is formed in a trench in the semiconductor. The transistor then occupies far less semiconductor substrate surface and so enables a high component density circuit to be obtained.

The present invention expands upon my copending invention, TRENCH GATE METAL-OXIDE-SEMICONDUCTOR TRANSISTOR, to provide a complimentary trench gate transistor, i.e., a trench gate p-type transistor and a trench gate n-type transistor formed in a common semiconductor substrate. This enables a preamplifier circuit to be made that dissipates less power than a single type transistor circuit. Low power dissipation is needed especially for high component density integrated signal processor circuits which are a part of an image detecting focal plane assembly that is operated at a cryogenic temperature.

The conventional complimentary MOS transistor is formed lateral to the substrate surface and is electrically isolated from the substrate by constructing it in a well of an impurity type opposite to the substrate. The trench gate complimentary transistor can alternatively employ a more readily formed, relatively shallow dopant diffused region around the trench to obtain this isolation.

SUMMARY OF THE INVENTION

A trench gate complimentary metal oxide semiconductor transistor is disclosed along with a resulting product. The process for forming the transistor comprises forming a trench within the semiconductor substrate, wherein the semiconductor substrate is doped to a first relative type opposite to the substrate type. A second region doped to the same relative type is applied about the surface of the trench. An insulating layer is then formed within the trench upon said first layer. A region of conductive gate material is formed within the trench upon said insulating layer. Source and drain regions are formed by doping first and second regions adjacent the trench and within the initially doped region around the trench to the same relative type of the substrate. These source and drain regions are then isolated from the substrate by remaining portions of the first and second doped regions. The first layer therefore extends between said source and drain about said trench, and wherein the gate region is isolated from the first layer by the insulating layer.

In the presently preferred embodiment the substrate is formed of p-doped silicon and the trench is formed by reactive ion etching of the substrate. The first and second doped regions are formed by diffusing an n-type dopant into the trench and about the surface of the trench. The insulating layer is formed by oxidizing the trench surfaces to form a thin silicon dioxide insulating layer.

In the presently preferred embodiment the source and drain regions are formed by doping the substrate surface adjacent the trench to form n-doped regions, and then counter-doping the n-doped regions to form first and second p-type segments within said n-doped regions. Said p-doped segments being isolated from the substrate. The gate may be formed by completely filling the trench, adjacent the insulating layer, with a body of degenerately doped polysilicon.

BRIEF DESCRIPTION OF THE DRAWINGS

FIG. 4 illustrates a construction of a complimentary trench gate MOS transistor utilizing the formation of a well;

FIG. 5 illustrates the construction of a complimentary MOS transistor without the formation of a well;

FIGS. 6-11 illustrate the process of forming a complimentary MOS transistor such as illustrated at FIG. 5.

DETAILED DESCRIPTION OF THE PRESENTLY PREFERRED EMBODIMENT

Figure 1:
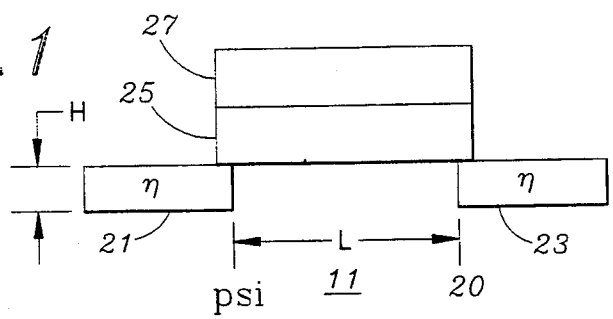
FIG. 1 is a cross-sectional view of a contemporary MOS transistor structure.

The detailed description set forth below in connection with the appended drawings is intended as a description of the presently preferred embodiment of the invention, and is not intended to represent the only form in which the present invention may be constructed or utilized. The description sets forth the functions and sequence of steps for construction of the invention in connection with the illustrated embodiment. It is to be understood, however, that the same or equivalent functions and sequences may be accomplished by different embodiments that are also intended to be encompassed within the spirit and scope of the invention. Furthermore, a similar trench gate embodiment can be used to form complimentary junction field effect transistors as well as the MOS field effect transistors described here.

As previously noted large numbers of closely spaced, high component density integrated circuit processor channels may be used in on-focal plane signal processors. Each detector element in the detector array may be connected to a preamplifier, such as a CMOS preamplifier, in an analog processor circuit. Low preamplifier noise is essential to prevent degradation of detector sensitivity. Since the preamplifiers are operated at low frequency, a principal source of noise is flicker or 1/f noise. The 1/f noise is inversely proportional to the area of the channel or gate regions of an MOS transistor, as expressed in the following equation:

$$\overline{v^2} = \frac{K\Delta f}{C_{ox}W} Lf,$$

where
v = the characteristic noise in microvolts;
K = a constant;
$\Delta f$ = bandwidth
f = the frequency of operation;
$C_{ox}$ = characteristic capacitance of the oxide layer;
W = the width of the gate; and
L = the length of the gate.
See: R. Gregorian and G.C. Temes, *Analog MOS Integrated Circuits In Signal Processing*, John Wiley & Sons, N.Y., N.Y. (1986).

A large area gate region in a MOS transistor will produce a low 1/f noise component. However, such a structure requires a large amount of semiconductor surface area. This makes it difficult to obtain a high density of such integrated circuit functions. The present invention is directed to a structure and process for enhancing the area of the gate region without enhancing the semiconductor surface area.

The MOS transistor gate region may be regarded as a capacitor, which is formed by a metal oxide semiconductor cross section. Large area capacitors that preserve semiconductor surface are obtained in bulk silicon by using the walls of trenches, grooves or holes, which are cut in silicon, for example, by plasma or reactive ion etching. In such a manner, gate region area may be enhanced by using the depth of the trench to enlarge the electrode channel area without the need to use a large amount of the semiconductor surface. The present invention recognizes the capacitive characteristics of the MOS transistor gate region and applies particular trench forming techniques to the construction of the MOS transistor. In such a manner the MOS transistor gate channel area or gate channel region, is enhanced, mitigating 1/f noise, without the need to use large amounts of the semiconductor surface.

FIG. 1 illustrates an n-MOS transistor constructed in accordance with conventional techniques. As shown therein MOS transistor 11 is formed of an n-doped source region 21 and an n-doped drain region 23 formed in p-doped silicon 20. The source and drain regions are bridged by an insulating layer, e.g. insulating layer 25, which may be formed of material such as silicon dioxide ($SiO_2$) or silicon nitride. A conductive gate area 27 is disposed on the upper surface of the insulator 25. The gate 27 is typically formed of metal or doped polysilicon.

In relation to FIG. 1 the characteristic 1/f noise is related to the width and length of the gate area intermediate to the source and drain. The length of the gate area, labeled L, is shown at FIG. 1. The width of the gate area is orthogonal to the plane of the drawing. By increasing the length of the gate L, 1/f noise is reduced, though the maximum speed at which the circuit will efficiently operate is reduced. The present invention is directed to a construction and technique wherein the gate area is enhanced without the need to appropriate greater surface area of the semiconductor wafer.

Figure 2:
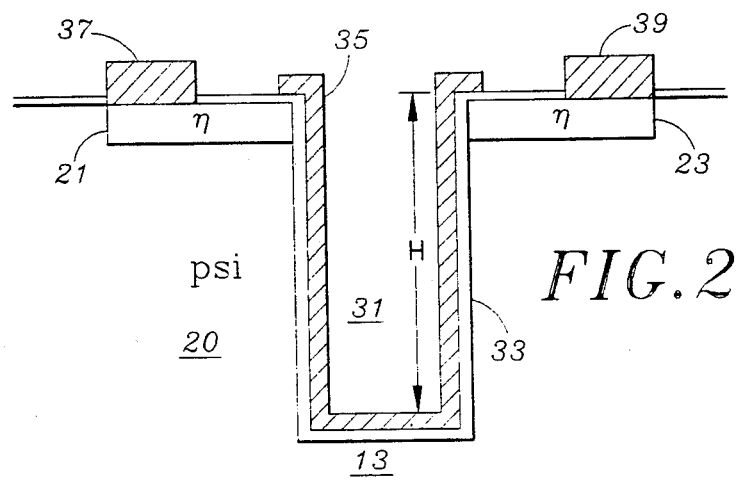
FIG. 2 is a cross-sectional view of a transistor formed in accordance with the present invention.

FIG. 2 illustrates one embodiment of the present invention. As with MOS transistor 11 shown at FIG. 1, MOS transistor 13 comprises an n-doped source region 21, and an n-doped drain region 23, both formed in p-doped silicon 20. Unlike the construction shown at FIG. 1, a trench 31 is formed in the silicon substrate. The trench may be formed by any of a variety of techniques, such as reactive ion etching. An insulating layer 33 is disposed on the vertical and bottom surface of the trench 31. In the presently preferred embodiment the insulating layer 33 is a thin film of silicon dioxide formed by thermal oxidation of the silicon. A conductive film 35, which serves as the gate, is then disposed on the upper surface of insulating layer 33. The gate layer 35 may be formed of conductive material, such as metal or of degenerately doped semiconductor material, e.g. polysilicon. In an alternative structure the trench can be filled with an insulator material such as $SiO_2$ or with a conductive material without the need for a conductive film liner. Electrodes 37, 39 may be formed on the upper exposed surfaces of source 21 and drain 23, respectively. Where the insulating layer 33 extends above the surfaces of source 21 and drain 23, the $SiO_2$ may be etched by any of a number of contemporary techniques to facilitate the formation of the electrodes. An additional electrode (not shown) may be formed to facilitate contact with the gate layer 35.

In accordance with the construction shown at FIG. 2 the gate region intermediate to the source 21 and drain 23 is enlarged by means of a formation of trench 31. In the presently preferred embodiment trench 31 is formed to be up to approximately 10 to 20 microns deep and 2 to 3 microns wide. The length of the trench (orthogonal to the plane of FIG. 1) is in the range of 10 to 20 microns. The particular dimensions may be selected in accordance with the desired noise characteristics and speed of the transistor, and the available surface area.

Figure 3:
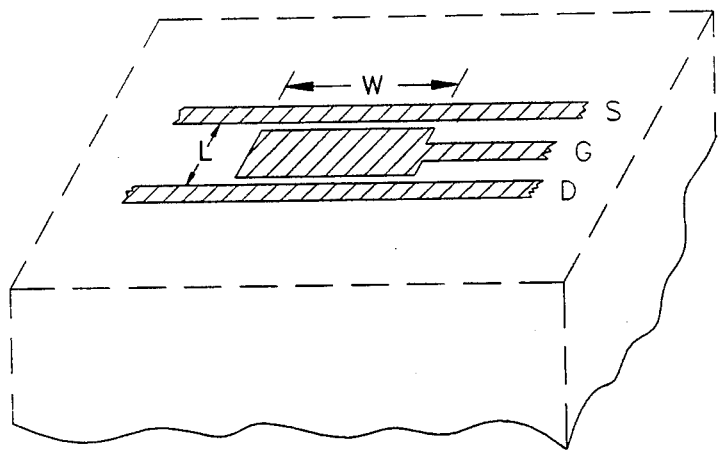
FIG. 3 is a top perspective view of the transistor illustrated at FIG. 2.

A perspective view of a MOS transistor formed in accordance with FIG. 2 is illustrated at FIG. 3. FIG. 3 illustrates the arrangement of source, gate, and drain electrodes on the semiconductor substrate surface. A filled trench is depicted.

It is anticipated that the gate would be connected to a dedicated detector element and the drain to a storage capacitor which may be selectively interrogated by the further processing circuitry (not shown). The source may be connected to a low level bias circuit, or alternatively may be sustained at a substantially zero level, as may be desired.

The construction illustrated at FIGS. 2 and 3, therefore provides advantages of low 1/f noise without the penalty in terms of semiconductor surface area. Though certain penalties may be inherited in terms of the speed of the MOS transistor, though in certain applications the speed limitations are not restrictive. On the contrary, 1/f noise reduction is needed in low speed imaging system, for example, for highest sensitivity.

FIGS. 4 and 5 illustrate the construction of a complimentary MOS transistor. FIG. 4 illustrates a well region of opposite type to the substrate. FIG. 5 illustrates a diffused region opposite type to the substrate which is an alternative structure to the well. The source and drain regions for both transistors are doped to the same type as the substrate. Both source and drain are p-doped, as is the substrate. Consequently, the complimentary MOS transistor must be constructed in such a way that the source and drain are not only insulated from the gate region, but also from the substrate. FIGS. 4 and 5 illustrate a complimentary MOS transistor construction, using the trench forming techniques of the present invention.

FIGS. 6-11 illustrate an exemplary manner of construction to form the complimentary MOS transistor illustrated at FIG. 5.

Referring to FIG. 4 complimentary MOS transistor 51 is illustrated. The MOS transistor includes source 53, drain 55 and gate 57. Substrate 59, as with the embodiment illustrated at FIG. 2, can be formed of p-doped silicon. The source region 53 and drain region 55 are also formed of p-doped material, such as p-doped silicon. Gate 57 is formed of conductive material, such as metal or degenerately doped polysilicon. Gate insulator layer 61 extends about the gate region 57 and serves as an insulating layer about the gate 57.

Because the substrate 59 is of the same dopant type as the source and drain, it is necessary to isolate the source and drain from the substrate in order to insure proper operation of the MOS transistor. In the embodiment illustrated at FIG. 4, this is effected by first forming a well within the substrate 59. The n-doped layer extends beyond the source 53 and the drain 55 to permit proper operation of the MOS transistor within the p-doped substrate 59.

FIG. 5 illustrates an alternate construction of the complimentary MOS transistor illustrated at FIG. 4, wherein the need to form a well of n-doped material is eliminated and replaced with narrow regions of doped substrate around the trench and the source and drain. In such a manner the fabrication is simplified by eliminating the need for a very deep diffusion.

In the embodiment illustrated at FIG. 5 the MOS transistor 71 includes source region 53, drain region 55 and gate region 57. Insulating layer 61 surrounds the gate region 57. Unlike the complimentary MOS transistor 51, illustrated at FIG. 4, the MOS transistor 71 does not include a well area 63. Instead, a layer 73 is formed about the gate area after the trench is formed. The layer 73 is formed by an n-type diffusion in the substrate. The layer 73 extends between the source 53 and drain 55, and continues to encompass source 53 and drain 55 on the upper surface of MOS 71. In practice regions 72 and 74 about source 53 and drain 55 may be formed separately from the remaining portion of layer 73 extending about the trench gate region, e.g., by diffusion at the surface. Further details of the construction of the MOS transistor 71 are set forth in connection with FIGS. 6-11.

Construction of a trench gate complimentary MOS transistor in accordance with the present invention proceeds as follows. Trench 70 is first cut in the surface of the substrate 72. A layer region of material 73 is formed on the sides and bottom of the trench 70. This layer 73 may be formed by diffusing doped material into the trench walls and floor. In the illustrated embodiment the layer 73 is n-type to form an n-channel region within the p-doped silicon substrate. An insulating layer 61 is then applied to the n-doped layer 73. The insulating layer 61 may be formed by oxidizing the surface of n-doped silicon layer 73. In the presently preferred embodiment insulating layer 61 is formed of silicon dioxide. The source and drain segments 53, 55 are then formed by counter doping from the surface of the silicon substrate to form p-doped regions. Before formation of such segments, the surface may have been, as described, doped to form n-doped regions to insure that an n-doped region surrounds the source and drain. The p-doped segmments 53, 55 are therefore disposed within the n-doped segments 72, 74. The p-doped segments 72, 74 can be viewed as extensions of the layer 73. Thus, the layer 73 can be viewed as extending about and isolating the source region 53 and drain region 55.

Next, the trench is filled with conductive material. In the presently preferred embodiment gate region 57 is formed by filling the trench with degenerately doped polysilicon. It is to be understood that the gate region 57 may alternatively be formed by depositing a conductive layer over insulating layer 61 rather than filling the channel, as illustrated at FIG. 2. Finally, electrodes are applied at the source, gate and drain regions to facilitate interconnection to external circuitry. As will be understood by one of ordinary skill in the art, the electrodes and connections are made as they are conventionally for CMOS transistor circuits.

In the presently preferred embodiment, the MOS transistor may be formed such that the transistor gate region, as defined by the gate 57 and adjacent insulating layer, has a width of 2 to 3 microns, a height up to 10 to 20 microns and a width up to 10 to 20 microns. It is to be understood, however, that the MOS transistor may be constructed to be of a different size in accordance with the desired performance characteristics.

As discussed above various modifications and substitutions may be effected to impliment the structure and function of the invention, without departing from the spirit and scope of the invention.

What is claimed is:

1. A method of forming a trench gate complimentary metal oxide semiconductor transistor comprising:
    forming a trench within a semiconductor substrate, the semiconductor substrate being doped to a first conductivity type;
    after forming said trench, forming a first layer doped to a second conductivity type opposite to the substrate on the surfaces of the trench, said first layer having a thickness less than the depth of said trench;
    applying a layer of insulator about the surfaces of the trench and upon said first layer;
    doping a first region and a second region adjacent the trench to a second conductivity type;
    doping upper segments of said first and second regions to the same conductivity type as the substrate, said segments being isolated from the substrate by said first and second regions; and
    applying a layer of conductive gate material within said trench upon said layer of insulator;
    wherein said first and second segments form the source and drain, respectively, of the transistor, and said first layer extends between said source and drain about said trench, and wherein said gate material is isolated from said first layer by said layer of insulator; and
    wherein forming said first layer such that it has a thickness less than the depth of the trench eliminates the need for deep diffusion.

2. The process as recited in claim 1 wherein said substrate is formed of p-doped silicon.

3. The transistor as recited in claim 1 wherein the step of forming a trench within a semiconductor substrate comprises forming a trench which is between 10 to 20 microns deep, between 2 to 3 microns wide, and between 10 to 20 microns long.

4. The transistor as recited in claim 1 wherein the step of forming a trench within a semiconductor substrate comprises forming a trench which is between 10 to 20 microns deep, between 2 to 3 microns wide, and between 10 to 20 microns long.

5. The process as recited in claim 1 wherein said step of forming a trench comprises reactive ion etching of the substrate.

6. The process as recited in claim 5 wherein said first layer is formed of n-doped silicon diffused into the trench to form an n-region channel.

7. The process as recited in claim 6 wherein said insulating layer is formed by oxidizing the surface of said n-doped silicon first layer to form a silicon dioxide insulating layer.

8. The process as recited in claim 7 wherein said first and second regions are formed by doping the substrate surface adjacent the trench to form n-doped regions, and then counter-doping the n-doped regions to form first and second, p-type segments within said n-doped regions, said p-doped segments being isolated from the substrate.

9. The process as recited in claim 8 wherein the step of applying a layer of gate material comprises filling the trench with degenerately doped polysilicon.

10. The process as recited in claim 8 wherein the step of applying a layer of gate material comprises filling the trench with metal.

* * * * *